United States Patent [19]

Kobayashi

[11] Patent Number: 4,962,585
[45] Date of Patent: Oct. 16, 1990

[54] CONNECTIVE JUMPER AND METHOD OF MANUFACTURING THE SAME

[75] Inventor: Eiji Kobayashi, Itami, Japan

[73] Assignee: Mitsubishi Denki Kabushiki Kaisha, Tokyo, Japan

[21] Appl. No.: 453,857

[22] Filed: Dec. 20, 1989

Related U.S. Application Data

[62] Division of Ser. No. 197,971, May 24, 1988, Pat. No. 4,907,991.

[30] Foreign Application Priority Data

Nov. 25, 1987 [JP] Japan .................. 62-298111

[51] Int. Cl.⁵ .................. H01R 9/09
[52] U.S. Cl. .................. 29/885; 439/55
[58] Field of Search .................. 439/55, 78, 83, 876, 439/507; 361/404, 405; 228/179, 180.1, 180.2; 174/52.4; 357/69, 70; 29/840, 843, 874, 885

[56] References Cited

U.S. PATENT DOCUMENTS

| | | | |
|---|---|---|---|
| 3,519,890 | 7/1970 | Ashby | 357/69 |
| 3,729,816 | 5/1973 | Burns | 29/593 |
| 4,625,260 | 11/1986 | Jordan et al. | 29/840 |
| 4,775,917 | 10/1988 | Eichihorn et al. | 29/843 |
| 4,869,671 | 9/1989 | Pressley et al. | 439/55 |

FOREIGN PATENT DOCUMENTS

| | | | |
|---|---|---|---|
| 56-24963 | 3/1981 | Japan | 357/70 |
| 56-59596 | 5/1981 | Japan | 228/179 |
| 60-121064 | 6/1985 | Japan | 228/180.1 |
| 60-130132 | 7/1985 | Japan | 357/69 |
| 61-214548 | 9/1986 | Japan | 357/70 |
| 583285 | 12/1946 | United Kingdom . | |
| 993984 | 6/1965 | United Kingdom . | |

*Primary Examiner*—Neil Abrams
*Attorney, Agent, or Firm*—Oblon, Spivak, McClelland, Maier & Neustadt

[57] ABSTRACT

In a connective jumper, recesses are defined in jumper connecting portions and surfaces of the recesses are plated. Thus, the connective jumper can be strongly soldered. Even if cracking is caused in the soldering portions, progress of cracking can be reduced since such cracking can be easily visually inspected. A manufacturing method whereby such connective jumpers can be efficiently manufactured with high mass productivity at a low manufacturing cost is also provided.

5 Claims, 5 Drawing Sheets

CONNECTIVE JUMPER AND METHOD OF MANUFACTURING THE SAME

This is a division of application Ser. No. 07/197,971, filed on May 24, 1988 now Pat. No. 4,907,991.

BACKGROUND OF THE INVENTION

1. Field of the Invention

The present invention relates to a connective jumper for electrically connecting prescribed two positions of a wiring pattern with each other while avoiding shorting to another wiring region and a method of manufacturing the same.

2. Description of the Prior Art

FIG. 8 is a perspective view showing a conventional connective jumper 1. As shown in FIG. 8, this connective jumper 1, being entirely formed by a metal material, comprises a jumper body 2 which is U-shaped in section and jumper connecting portions 3 outwardly extending from both ends of the jumper body 2. Excepting end surfaces 3a and 3b of the jumper connecting portions 3 and an end surface 2a of the jumper body 2, the connective jumper 1 is plated with Sn or the like.

In view of mass-productivity, such connective jumpers 1 are manufactured as follows: First, plating is performed on the surface of a metal plate 4 of 0.1 to 0.2 mm in thickness, as shown in FIG. 9. Then, the metal plate 4 is punched by a press along phantom lines 5 as shown in FIG. 9, while each segment obtained by such punching is simultaneously shaped by the press to obtain the connective jumper 1 as shown in FIG. 8.

FIG. 10 is a plan view showing a hybrid integrated circuit device 6 carrying such a connective jumper 1, and FIG. 11 is a sectional view taken along the line X–X in FIG. 10. The hybrid integrated circuit device 6 comprises an insulating substrate 7 which is formed thereon with a wIring pattern 8 of a thick film conductor, a thick film resistor 9 etc. A flip chip IC element 10 and the connective jumper 1 are mounted on prescribed portions of the wiring pattern. The connective jumper 1 is mounted as follows: Soldering paste 11 obtained by kneading solder powder and flux etc. is coated on a portion of the wiring pattern s for carrying the connective jumper 1 by printing etc., and thereafter the jumper connecting portions 3 of the connective jumper 1 are temporarily placed on the coated portion. Then the insulating substrate 7 is heated at a temperature exceeding the melting point of the soldering paste 11 to melt the soldering paste 11, and thereafter cooled to a temperature lower than the melting point of the soldering paste 11 to solidify the soldering paste 11, thereby to electrically and mechanically connect the connective jumper 1 to the wiring pattern 8.

In such a conventional connective jumper 1, the end surfaces 3a of the jumper connecting portions 3 are not plated and hence the end surfaces 3a are insufficiently connected with the soldering paste 11 when the connective jumper 1 is soldered onto the wiring pattern 8, as shown in FIG. 11. Consequently, bond strength between the connective jumper 1 and the wiring pattern 8 is reduced. Therefore, when an endurance test is performed upon completion of soldering through temperature cycling of at least 200 cycles with a cycle of temperature change of −40° to 125° C., for example, shearing stress is applied to junctions between the jumper connecting portions 3 and the soldering paste due to difference in thermal expansion coefficient between the insulating substrate 7 and the connective jumper 1, to cause cracking in the soldering paste 1 and the wiring pattern 8 along the end surfaces 3a. Thus, the wiring pattern 8 is disconnected or the soldered portions are displaced in the worst case. Further, since the end surfaces 3a linearly extend along the cross direction of the connective jumper 1, cracking caused on the soldering paste 11 along the end surfaces 3a rapidly progresses while it is difficult to visually inspect such cracking.

SUMMARY OF THE INVENTION

The present invention is directed to a connective jumper for electrically connecting prescribed two portions of a wiring pattern formed on an insulating substrate while avoiding shorting to another wiring region and a method of manufacturing the same.

A connective jumper according to a first invention comprises a jumper body and jumper connecting portions which are formed to outwardly extend from both end portions of the jumper body and having recesses in forward ends thereof. Plating is performed at least on surfaces of the recesses and areas being faced with the wiring portions within the surfaces of the jumper connecting portions.

A method of manufacturing a connective jumper according to a second invention includes a first step of defining a plurality of holes longitudinally along a strip-shaped metal plate at intervals, a second step of performing plating over the entire surface of the strip-shaped metal plate provided with the holes, a third step of cutting the plated strip-shaped metal plate in positions of the holes along the cross direction to make segments, and a fourth step of shaping the segments so as to be given prescribed forms by a press.

A method of manufacturing a connective jumper according to a third invention includes a first step of defining a plurality of holes longitudinally along a strip-shaped metal plate at intervals, a second step of cutting the strip-shaped metal plate in positions of the holes along the cross direction to make segments, a third step of shaping the segments so as to be given prescribed form by a press, and a fourth step of performing plating over the entire surfaces of the segments shaped by the third step.

Accordingly, a principal object of the present invention is to provide a connective jumper which can be strongly soldered onto prescribed portions of a wiring pattern formed on an insulating substrate and a method of manufacturing the same.

Another object of the present invention is to provide a connective jumper which can reduce progress of cracking that may be caused in soldering paste and a method of manufacturing the same.

Still another object of the present invention is to provide a connective jumper which enables visual inspection of cracking caused in soldering paste and a method of manufacturing the same.

In the connective jumper according to the first invention, the recesses are so defined in the jumper connecting portions that the surfaces of the jumper connecting portions are plated, whereby solder is sufficiently connected to the surfaces of the recesses to enable strong soldering. Further, the end surfaces of the jumper connecting portions are provided in nonlinear configurations by the recesses, whereby progress of cracking, that might be caused in soldering portions, can be reduced while such cracking can be easily visually inspected.

In the method of manufacturing a connective jumper according to the second or third invention, such connective jumpers can be efficiently manufactured with high mass-productivity at a low manufacturing cost.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a perspective view showing a connective jumper according to a third embodiment of the present invention;

DESCRIPTION OF THE PREFERRED EMBODIMENTS

Figure 1:
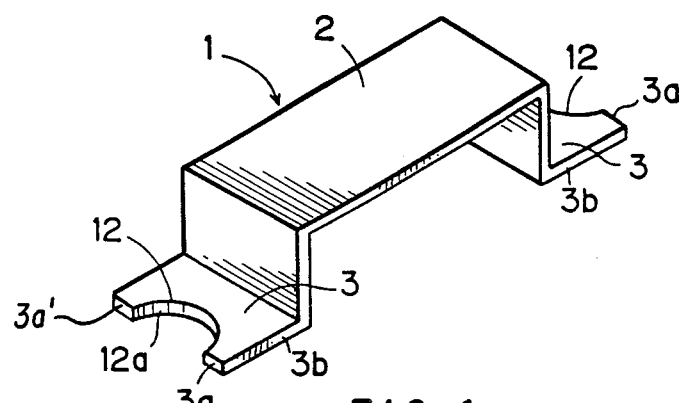
FIG. 1 is a perspective view showing a connective jumper according to a first embodiment of the present invention.
Figure 8:
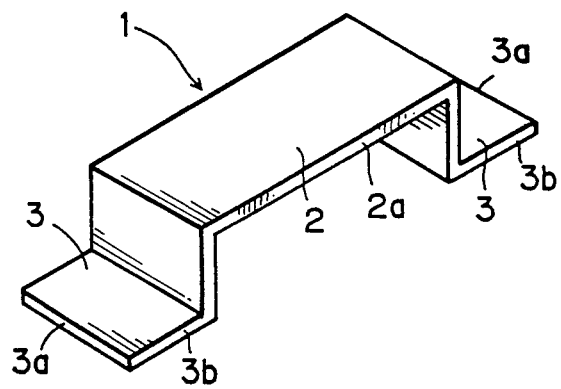
FIG. 8 is a perspective view showing a conventional connective jumper.
Figure 9:
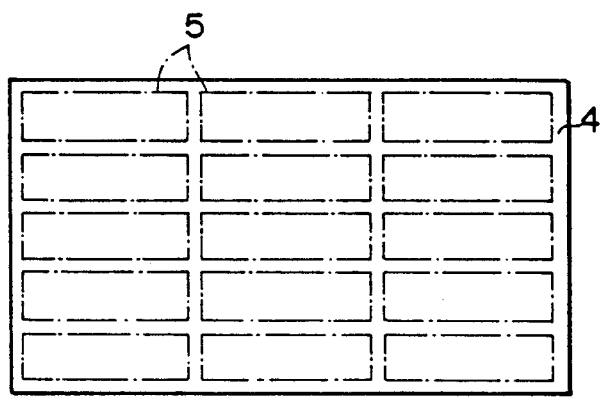
FIG. 9 is a diagram for illustrating a method of manufacturing the conventional connective jumper.
Figure 10:
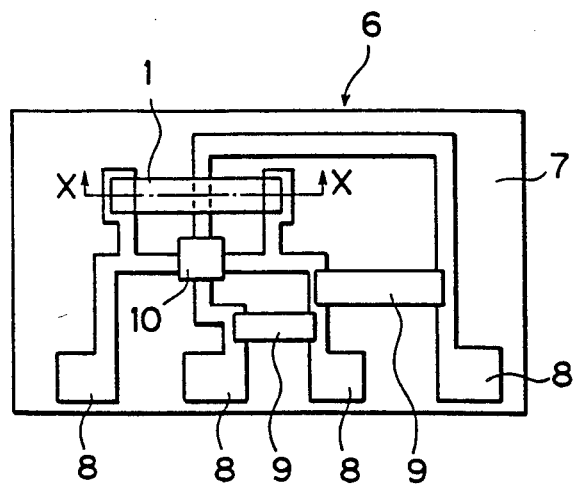
FIG. 10 is a plan view of a hybrid integrated circuit device carrying the conventional connective jumper.
Figure 11:
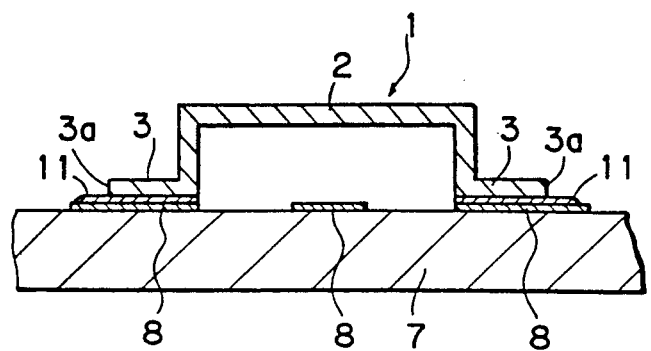
FIG. 11 is a sectional view taken along the line X—X in FIG. 10.

FIG. 1 is a perspective view showing a connective jumper 1 according to an embodiment of the present invention. This connective jumper 1 has semicircular recesses 12, which are defined in jumper connecting portions 3 to be continuous to transverse end surfaces 3a and 3a' thereof. Excepting the end surfaces 3aand 3a', plating is performed over the entire surface of the connective jumper 1 including surfaces 12a of the recesses 12. Other structure of this embodiment is identical to that of the prior art as shown in FIG. 8, and hence identical parts are indicated by the same reference numerals to avoid redundant description.

Figure 2:
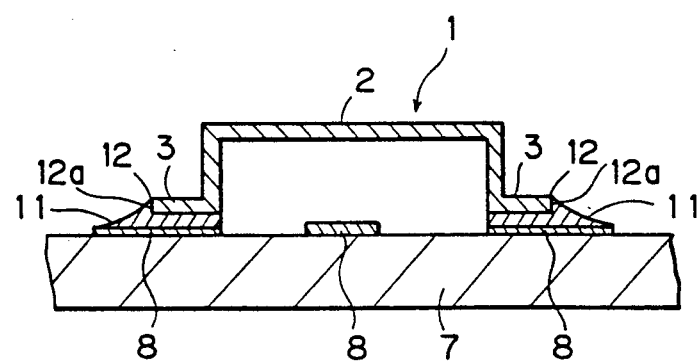
FIG. 2 is a sectional view showing a mounting state of the connective jumper.

The connective jumper is mounted on an insulating substrate 7 through soldering paste 11, in a similar manner to the conventional case. As shown in FIG. 2, the soldering paste 11 is coated on portions of a wiring pattern 8 for carrying the connective jumper 1, and thereafter the jumper connecting portions 3 of the connective jumper 1 are temporarily placed on the coated portions. Then the insulating substrate 7 is heated at a temperature exceeding the melting point of the soldering paste 11 to melt the soldering paste 11. Thereafter the insulating substrate 7 is cooled to a temperature lower than the melting point of the soldering paste 11 to solidify the soldering paste 11, thereby to electrically and mechanically connect the connective jumper 1 to the wiring pattern 8.

In the connective jumper 1 of this embodiment, the semicircular recesses 12 are so defined in the jumper connecting portions 3 that the surfaces 12a thereof are plated, whereby the soldering paste 11 is sufficiently connected to the surfaces 12a of the recesses 12 to enable strong soldering. Therefore, even if an endurance test such as a temperature cycling test is performed, cracking is hardly caused along the end surfaces 3a and 3a' and the surfaces 12a on the soldering paste 11 and the wiring pattern 8. Thus, disconnection of the wiring pattern 8 and displacement of soldering portions can be prevented. Even if cracking is caused, progress of such cracking is reduced since the end surfaces 3a and 3a' of the jumper connecting portions 3 are provided in nonlinear configurations by the recesses 12, while such cracking can be easily visually inspected.

Figure 3:
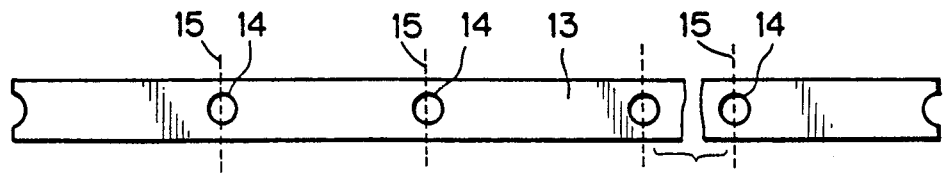
FIGS. 3 and 4 are diagrams for illustrating a method of manufacturing the connective jumper as shown in FIG. 1.
Figure 4:
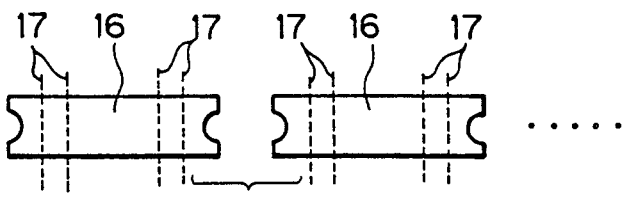

The connective jumper 1 as shown in FIG. 1 is manufactured as follows. First, a plurality of round holes 14 are defined at regular intervals longitudinally along a strip-shaped metal plate 13 of 0.1 to 0.2 mm in thickness, as shown in FIG. 3 (first step). Then, plating is performed by Sn or the like over the entire surface of the strip-shaped metal plate 13 provided with the round holes 14 (second step). Thereafter the strip-shaped metal plate 13 is cut along broken lines 15 as shown in FIG. 3 in central positions of the round holes 14 along the cross direction to make segments 16 (third step). Finally, each segment 16 made by cutting the strip-shaped metal plate 13 is shaped by a press or the like to be bent in positions as shown by broken lines 17 in FIG. 4, thereby to obtain &he connective jumper 1 as shown in FIG. 1 (fourth step). The third and fourth steps may be simultaneously performed by a press or the like. A large number of connective jumpers 1 as shown in FIG. 1 can be efficiently manufactured through the aforementioned method wi&h high mass productivity at a low manufacturing cost.

Although no plating is performed on the end surfaces 3a and 3a', of the jumper connecting portions 3 of the connective jumper 1 according to the aforementioned embodiment the end surfaces 3a and 3a' may be plated, as a matter of course. Such a connective jumper is manufactured as follows: First, a plurality of round holes 14 are defined longitudinally along a strip-shaped metal plate of 0.1 to 0.2 mm in thickness at regular intervals, as shown in FIG. 3 (first step). Then, the strip shaped metal plate 13 is cut in central positions of the round holes 14 along the broken lines 15 in FIG. 3 along the cross direction to make segments 16 (second step). Thereafter each segment 16 made by cutting the strip-shaped metal plate 13 is shaped to be bent in positions shown by the broken lines 17 in FIG. 4 by a press (third step). Finally, plating is performed by Sn or &he like over the entire surface of each segment 16 thus shaped to obtain a connective jumper those surface, including the end surfaces 3a and the surfaces 12a, is entirely plated (fourth step). The connective jumper obtained by such a method can be further strongly soldered since plating is performed not only on the surfaces 12a of recesses 12, but also on the end surfaces 3a and 3a'. of jumper connecting portions 3.

Figure 5:
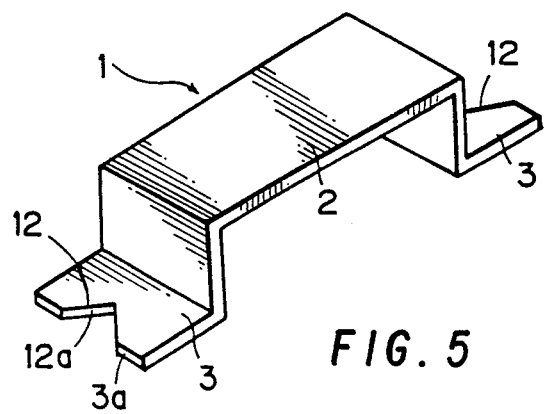
Figure 6:
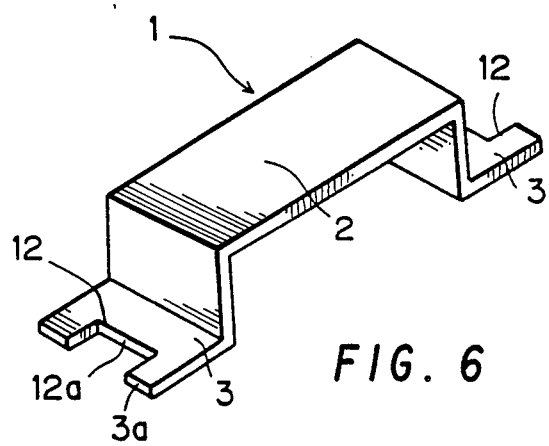
FIG. 6 is a perspective view showing a connective jumper according to a second embodiment of the present invention.
Figure 7:
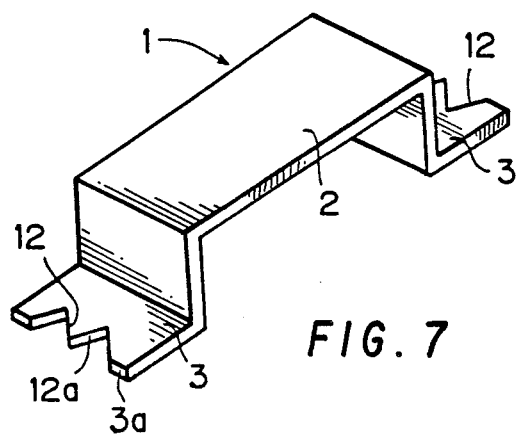
FIG. 7 is a perspective view showing a connective jumper according to a fourth embodiment of the present invention.

Although the recesses 12 are semicircularly formed in the aforementioned embodiment, configurations of the recesses 12 are not particularly restricted. Such recesses 12 may be triangular as shown in FIG. 5, quadrangular as shown in FIG. 6, or serrated as shown in FIG. 7, for example.

Although the present invention has been described and illustrated in detail, it is clearly understood that the same is by way of illustration and example only and is not to be taken by way of limitation, the spirit and scope of &he present invention being limited only by the terms of the appended claims.

What is claimed is:

1. A method of manufacturing a connective jumper provided to extend over a pair of conductors on an insulating substrate to be soldered to said conductors, said method comprising:
    a first step of defining a plurality at holes longitudinally along a strip-shaped metal plate at intervals;
    a second step of performing plating over the entire surface of said strip-shaped metal plate provided with said holes;
    a third step of cutting said plated strip-shaped metal plate along the cross direction through the positions of said holes to make segments; and
    a fourth step of shaping the segments so as to be given prescribed form by a press.

2. A method of manufacturing a connective jumper in accordance with claim 1, wherein said third and fourth steps are simultaneously performed.

3. A method of manufacturing a connective jumper provided to extend over a pair of conductors on an insulating substrate to be soldered to said conductors, said method comprising:
    a first step of defining a plurality of holes longitudinally along a strip-shaped metal plate at intervals:
    a second step of cutting said strip-shaped metal plate along the cross direction through the positions of said holes to make segments;
    a third step of shaping the segments so as to be given prescribed form by a press; and
    a fourth step of performing plating over the entire surfaces of said shaped respective segments.

4. A method of manufacturing a connective jumper in accordance with claim 3, wherein said second and third steps are simultaneously performed.

5. A method of manufacturing a connective jumper in accordance with claim 4, wherein said first, second and third steps are simultaneously performed.

* * * * *